United States Patent
Shen

(10) Patent No.: US 10,018,429 B2
(45) Date of Patent: Jul. 10, 2018

(54) APPARATUS BODY HEAT DISSIPATION DEVICE

(71) Applicant: ASIA VITAL COMPONENTS CO., LTD., New Taipei (TW)

(72) Inventor: Ching-Hang Shen, New Taipei (TW)

(73) Assignee: Asia Vital Components Co., Ltd., New Taipei (TW)

(*) Notice: Subject to any disclaimer, the term of this patent is extended or adjusted under 35 U.S.C. 154(b) by 353 days.

(21) Appl. No.: 14/459,302

(22) Filed: Aug. 13, 2014

(65) Prior Publication Data

US 2016/0047607 A1 Feb. 18, 2016

(51) Int. Cl.
| | | |
|---|---|---|
| F04B 19/00 | (2006.01) |
| F24H 3/02 | (2006.01) |
| H01L 23/467 | (2006.01) |
| F28F 3/00 | (2006.01) |
| F04B 43/00 | (2006.01) |
| F04B 43/04 | (2006.01) |
| H01L 41/08 | (2006.01) |
| F21V 29/63 | (2015.01) |
| F04D 33/00 | (2006.01) |
| F04B 43/02 | (2006.01) |

(52) U.S. Cl.
CPC ............ *F28F 3/00* (2013.01); *F04B 43/0027* (2013.01); *F04B 43/043* (2013.01); *H01L 23/467* (2013.01); *F04B 43/02* (2013.01); *F04D 33/00* (2013.01); *F21V 29/63* (2015.01); *F28F 2250/08* (2013.01); *H01L 41/08* (2013.01)

(58) Field of Classification Search
CPC ...... H05K 7/20; H05K 7/20172; F21V 29/63; H01L 41/08; F28F 5/00; F28F 2215/14; F28D 11/00; F28D 11/06; F04D 33/00; F04B 43/02
USPC .......................................... 417/436; 165/121
See application file for complete search history.

(56) References Cited

U.S. PATENT DOCUMENTS

| 5,488,255 A * | 1/1996 | Sato ...................... F04B 43/043 |
| | | 257/717 |
| 6,232,680 B1 * | 5/2001 | Bae ........................ H01L 23/467 |
| | | 257/E23.099 |
| 6,252,769 B1 * | 6/2001 | Tullstedt ............... F04B 35/045 |
| | | 174/15.1 |

(Continued)

FOREIGN PATENT DOCUMENTS

| AT | 167983 B * | 3/1951 | ............ F04D 33/00 |
| CN | 101153617 A | 4/2008 | |

(Continued)

*Primary Examiner* — Len Tran
*Assistant Examiner* — Paul Alvare
(74) *Attorney, Agent, or Firm* — C. G. Mersereau; Nikolai & Mersereau, P.A.

(57) ABSTRACT

An apparatus body heat dissipation device includes an apparatus case, at least one plate body and at least one drive member. The apparatus case has at least one first opening and at least one second opening and a receiving space. The plate body is disposed in the receiving space. The drive member serves to drive the plate body to move within the receiving space to produce an air convection effect between the interior of the apparatus case and the ambient surrounding air of the apparatus case so that the air convection in the limited space of the apparatus body can be effectively enhanced to greatly enhance the heat dissipation efficiency.

4 Claims, 10 Drawing Sheets

(56) References Cited

U.S. PATENT DOCUMENTS

| | | | | |
|---|---|---|---|---|
| 7,619,894 B2* | 11/2009 | Wang | ................... | F04D 29/582 |
| | | | | 165/122 |
| 9,249,962 B2* | 2/2016 | Van Bommel | ........ | H01L 33/645 |
| 2002/0175596 A1* | 11/2002 | Garimella | ................ | F03G 7/06 |
| | | | | 310/328 |
| 2010/0065260 A1* | 3/2010 | Sakamoto | ............... | B06B 1/045 |
| | | | | 165/121 |
| 2011/0005733 A1* | 1/2011 | Wada | ...................... | F04D 33/00 |
| | | | | 165/121 |
| 2011/0063800 A1* | 3/2011 | Park | ....................... | F04D 33/00 |
| | | | | 361/697 |
| 2011/0277968 A1* | 11/2011 | Chao | .................... | F04B 43/043 |
| | | | | 165/120 |
| 2012/0086250 A1* | 4/2012 | Stoessel | ................ | B60N 2/449 |
| | | | | 297/284.9 |
| 2012/0240891 A1* | 9/2012 | Benham | ............... | F04B 43/023 |
| | | | | 123/193.1 |
| 2014/0193258 A1* | 7/2014 | Chang | ................. | F04D 29/601 |
| | | | | 416/66 |
| 2015/0029658 A1* | 1/2015 | Yairi | ....................... | G06F 1/20 |
| | | | | 361/679.47 |

FOREIGN PATENT DOCUMENTS

| | | | | | |
|---|---|---|---|---|---|
| CN | 101370373 A | | 2/2009 | | |
| CN | 102926979 A | | 2/2013 | | |
| FR | 1218663 A | * | 5/1960 | ............ | F04D 33/00 |
| FR | 2528500 A1 | * | 12/1983 | ............ | F04D 33/00 |
| GB | 1291576 A | * | 10/1972 | ............ | F04D 33/00 |
| GB | 1577582 A | * | 10/1980 | ............ | F04D 33/00 |
| JP | 2002339900 A | * | 11/2002 | | |
| JP | 2007218241 A | | 8/2007 | | |

* cited by examiner

APPARATUS BODY HEAT DISSIPATION DEVICE

BACKGROUND OF THE INVENTION

1. Field of the Invention

The present invention relates generally to a heat dissipation device, and more particularly to an apparatus body heat dissipation device, which can produce an air convection effect between the interior of the apparatus case and the ambient surrounding air of the apparatus case so that the air convection in the limited space of the apparatus body can be effectively enhanced to greatly enhance the heat dissipation efficiency.

2. Description of the Related Art

In recent years, electronic industries have rapidly developed and the performance of various electronic components has continuously enhanced. Therefore, the operation/processing speed of the electronic components has become faster and faster. Moreover, the operation speed of the internal chipsets of the electronic components has continuously increased and the number of the chips has continuously increased. As a result, the heat generated by the chips in operation has become higher and higher. In the case that the heat is not quickly dissipated in time, the performance of the electronic components will be greatly affected and the operation speed of the electronic components will be lowered. In some more serious cases, the electronic components may burn out due to high heat. Accordingly, how to efficiently dissipate the heat generated by the electronic components has become a critical topic. In general, a cooling fan is often used to dissipate the heat.

In addition, there is a trend to develop miniaturized electronic apparatuses such as notebooks, tablets and intelligent mobile phones. The internal space of such miniaturized electronic apparatus is quite small. A number of electronic components and circuit boards are arranged in the narrow space so that there is no room in the electronic apparatus for arrangement of a cooling fan. In some other cases, the necessary height of the fan impeller and bearing of the cooling fan makes it impossible to arrange the cooling fan in the thinned electronic apparatus. Therefore, without the cooling fan, the heat generated by the electronic components arranged in the electronic apparatus body is very likely to affect the normal operation of the electronic apparatus. As a result, the service cost of the electronic apparatus will be inevitably increased.

SUMMARY OF THE INVENTION

It is therefore a primary object of the present invention to provide an apparatus body heat dissipation device, which can produce an air convection effect between the interior of the apparatus case and the ambient surrounding air of the apparatus case.

It is a further object of the present invention to provide the above apparatus body heat dissipation device, which can enhance air convection in the limited space of the apparatus body to greatly enhance the heat dissipation efficiency.

To achieve the above and other objects, the apparatus body heat dissipation device of the present invention includes an apparatus case, at least one plate body and at least one drive member. The apparatus case has at least one first opening and at least one second opening and an internal receiving space in communication with the first and second openings. The plate body is disposed in the receiving space. The plate body has a first section and a second section positioned in adjacency to the first and second openings respectively. The drive member is disposed on the apparatus case. The drive member serves to drive the plate body to move within the receiving space so as to produce air convection between the first and second openings. Therefore, the air convection in the limited space of the apparatus body can be effectively enhanced to greatly enhance the heat dissipation efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
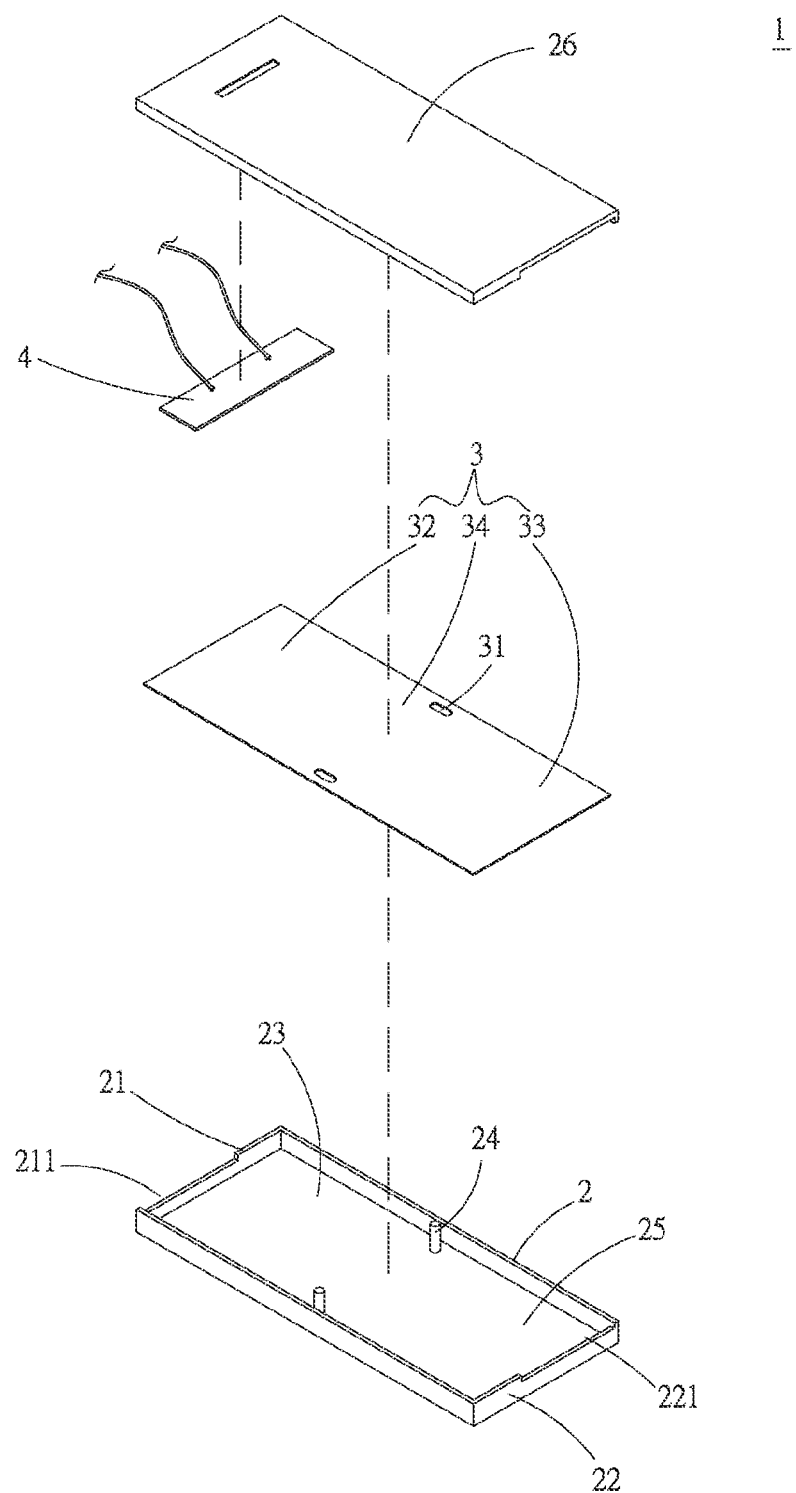
FIG. 1 is a perspective exploded view of a first embodiment of the present invention.
Figure 2:
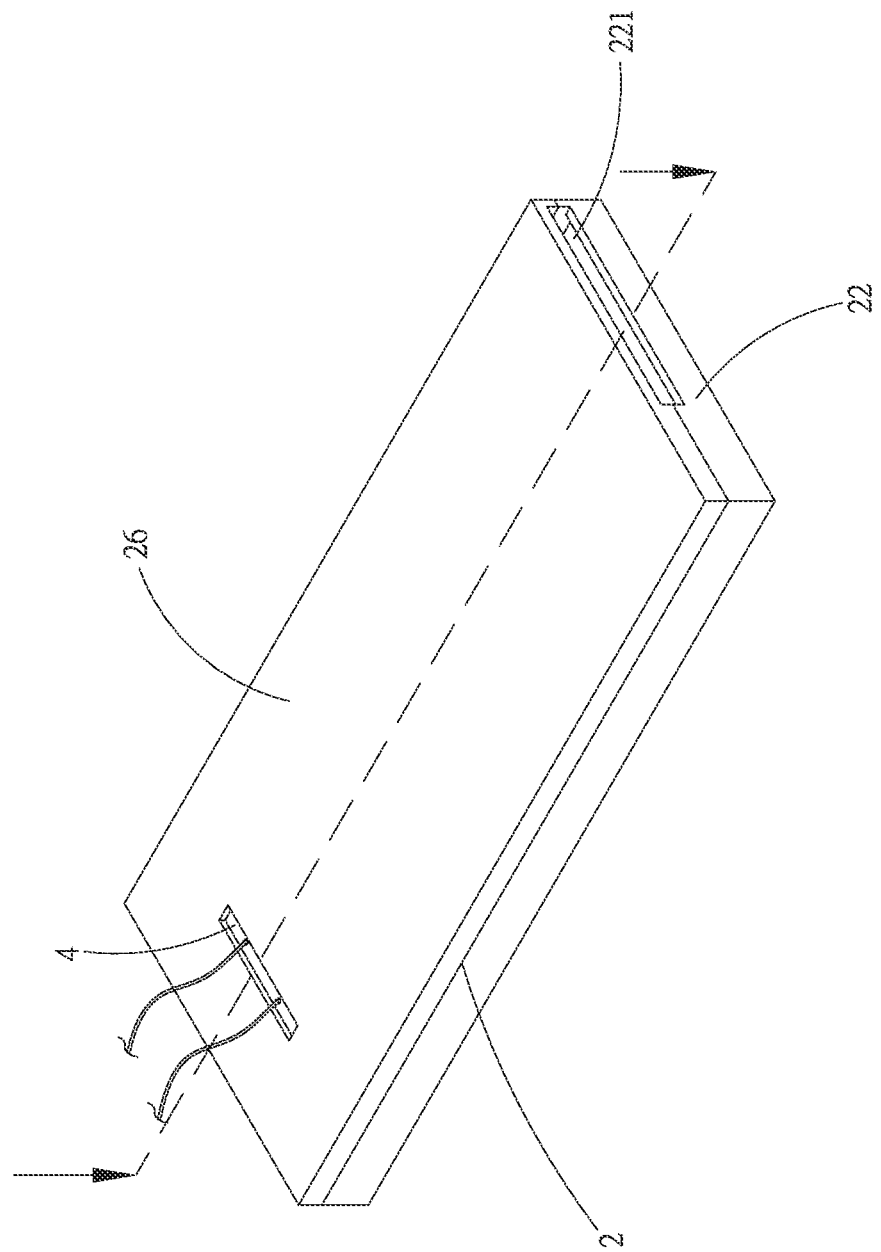
FIG. 2 is a perspective assembled view of the first embodiment of the present invention.

Please refer to FIGS. 1 and 2. FIG. 1 is a perspective exploded view of a first embodiment of the present invention. FIG. 2 is a perspective assembled view of the first embodiment of the present invention. According to the first embodiment, the apparatus body heat dissipation device 1 of the present invention includes an apparatus case 2, at least one plate body 3 and at least one drive member 4. The apparatus case 2 has a first side 21 and a second side 22. The first side 21 is formed with at least one first opening 211, while the second side 22 is formed with at least one second opening 221. In this embodiment, the first side 21 is formed with one first opening 211. The first opening 211 serves as an air inlet of the apparatus body heat dissipation device 1. The second side 22 is formed with one second opening 221. The second opening 221 serves as an air outlet of the apparatus body heat dissipation device 1. However, the arrangement is not limited to the above. Alternatively, the first opening 211 can be defined as the air outlet, while the second opening 221 can be defined as the air inlet. The apparatus case 2 has an internal receiving space 23 between the first and second openings 211, 221. At least one locating member 24 is disposed in the apparatus case 2. The locating member 24 extends from a bottom section 25 of the apparatus case 2 to a top section 26 of the apparatus case 2.

The plate body 3 is disposed in the receiving space 23 of the apparatus case 2. The plate body 3 has at least one perforation 31 formed in a position where the locating member 24 is positioned. In this embodiment, the plate body 3 is a flexible plate body. Two ends of the plate body 3 are respectively formed with a first section 32 and a second section 33 positioned in adjacency to the first and second openings 211, 221 respectively. The plate body 3 further has a middle section 34 between the first and second sections 32, 33. In this embodiment, the perforations 31 are formed on the middle section 34. The locating member 24 passes through the perforation 31 to extend to the top section 26 of the apparatus case 2.

The drive member 4 is disposed on the apparatus case 2. In this embodiment, the drive member 4 is, but not limited to, disposed on the top section 26 of the apparatus case 2. Alternatively, the drive member 4 can be disposed on the bottom section 25 of the apparatus case 2.

Figure 3A:
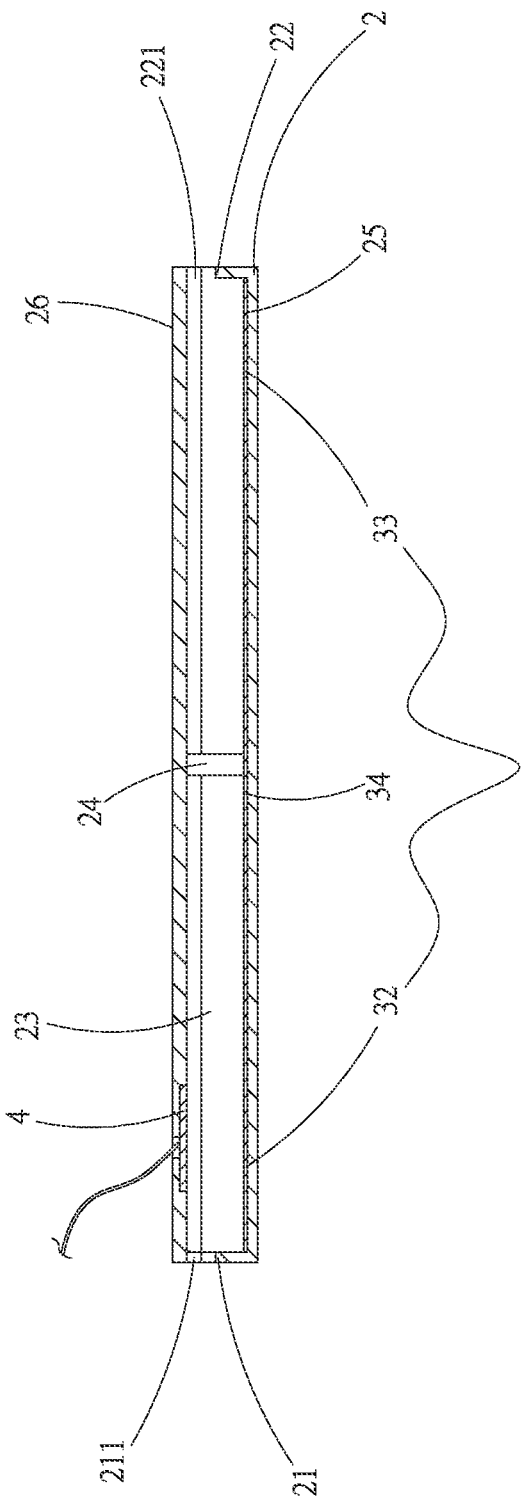
FIG. 3A is a sectional view of the first embodiment of the present invention, showing the application thereof in a first state.
Figure 3B:
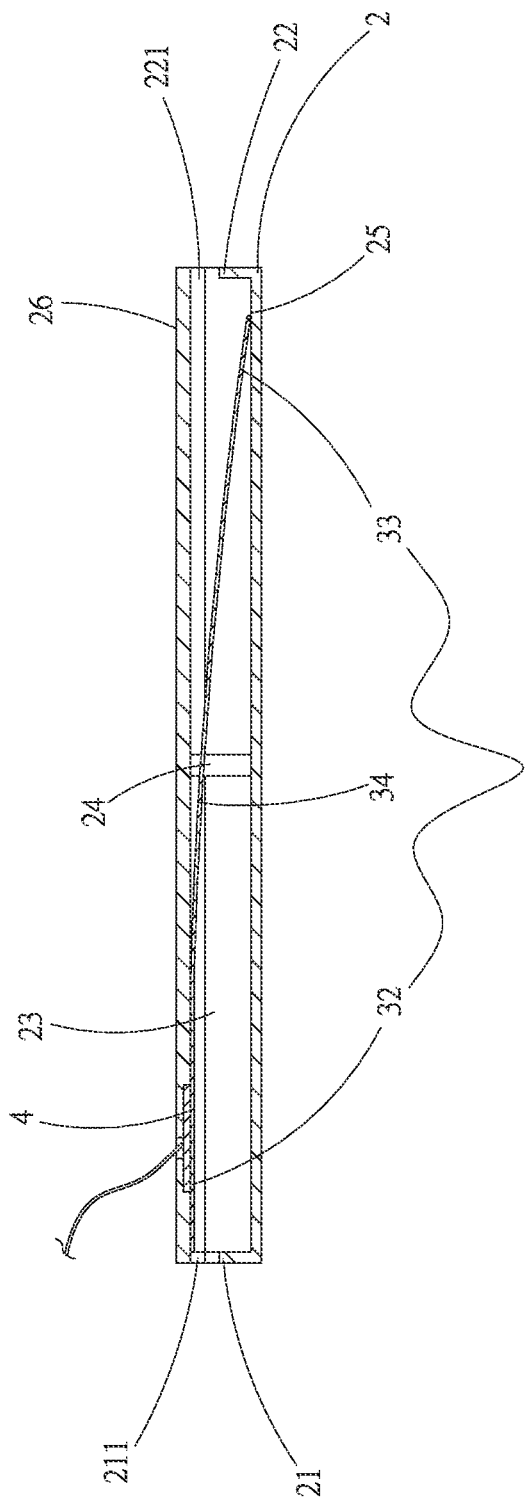
FIG. 3B is a sectional view of the first embodiment of the present invention, showing the application thereof in a second state.
Figure 3C:
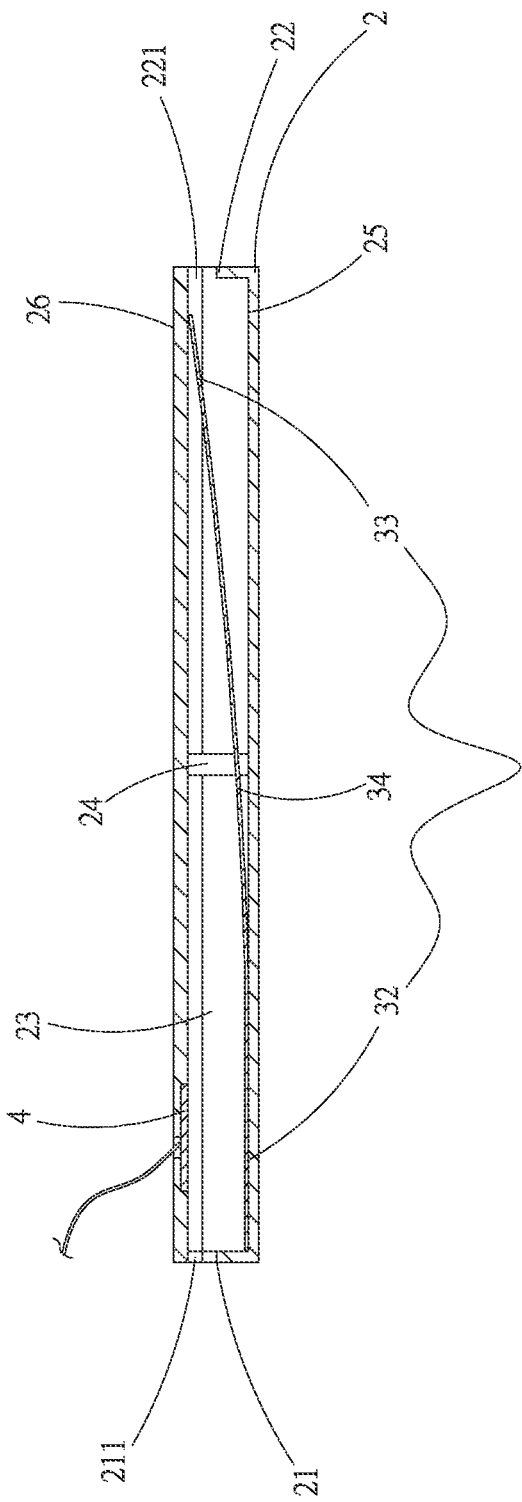
FIG. 3C is a sectional view of the first embodiment of the present invention, showing the application thereof in a third state.

Please now refer to FIGS. 3A, 3B and 3C. FIG. 3A is a sectional view of the first embodiment of the present invention, showing the application thereof in a first state. FIG. 3B is a sectional view of the first embodiment of the present invention, showing the application thereof in a second state. FIG. 3C is a sectional view of the first embodiment of the present invention, showing the application thereof in a third state. In this embodiment, the plate body 3 is a flexible plate body made of metal material. The plate body 3 is located in the receiving space 23 by means of the locating member 24. The drive member 4 is a magnetic member disposed on the first section 32. After powered on, the drive member 4 will magnetically attract the first section 32 of the plate body 3 to move the first section 32 toward the top section 26 of the apparatus case 2. After the drive member 4 is powered off, the first section 32 is moved toward the bottom section 25 to compress the air in the receiving space 23 to create airflow. The airflow flows from the first section 32 to the middle section 34 to press the middle section 34. At this time, the middle section 34 moves along the locating member 24 toward the top section 26 and at the same time drives the second section 33 to move toward the top section 26 until the airflow flows out from the second opening 221.

Thereafter, when the drive member 4 is again powered on, the first section 32 is again moved to the top section 26 of the apparatus case 2. When the first section 32 is totally moved to the top section 26, the air outside the apparatus case 2 flows from the first opening 211 into the receiving space 23 due to change of pressure. Then the drive member 4 is again powered off. At this time, the first section 32 is moved toward the bottom section 25 to compress the air in the receiving space 23 to create airflow. The airflow flows from the first section 32 to the middle section 34 to press the middle section 34. The middle section 34 moves along the locating member 24 toward the top section 26 and at the same time drives the second section 33 to move toward the top section 26 until the airflow flows out from the second opening 221. Accordingly, an air convection effect takes place between the exterior of the apparatus case 2 and the interior of the apparatus case 2 so that the heat generated by the heat source in the apparatus case 2 can be dissipated. Therefore, the air convection in the limited space of the apparatus body can be effectively enhanced to greatly enhance the heat dissipation efficiency.

Figure 4A:
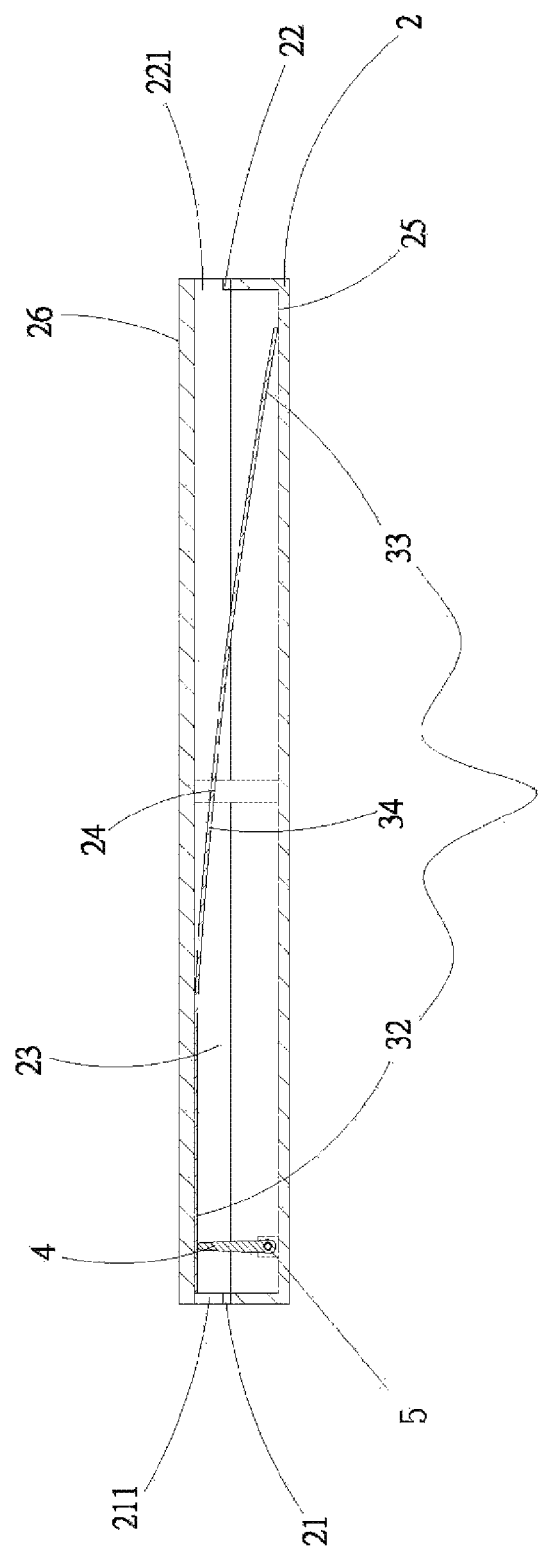
FIG. 4A is a sectional view of a second embodiment of the present invention, showing the application thereof in a first state.
Figure 4B:
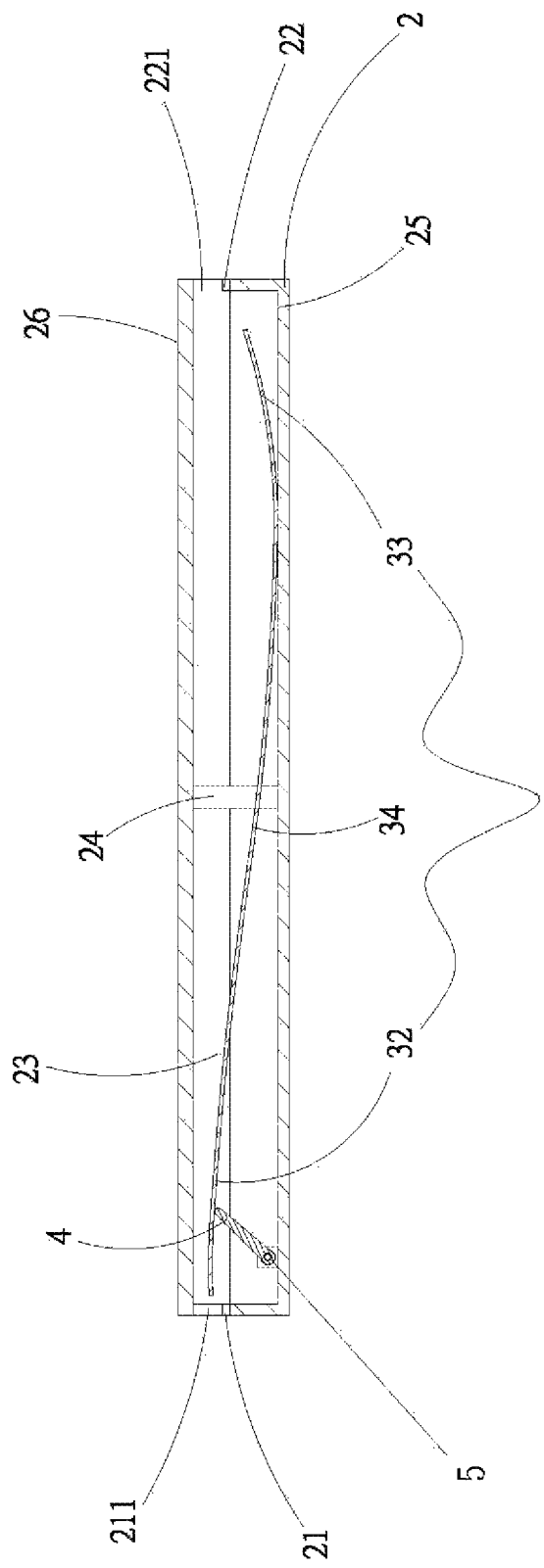
FIG. 4B is a sectional view of the second embodiment of the present invention, showing the application thereof in a second state.
Figure 4C:
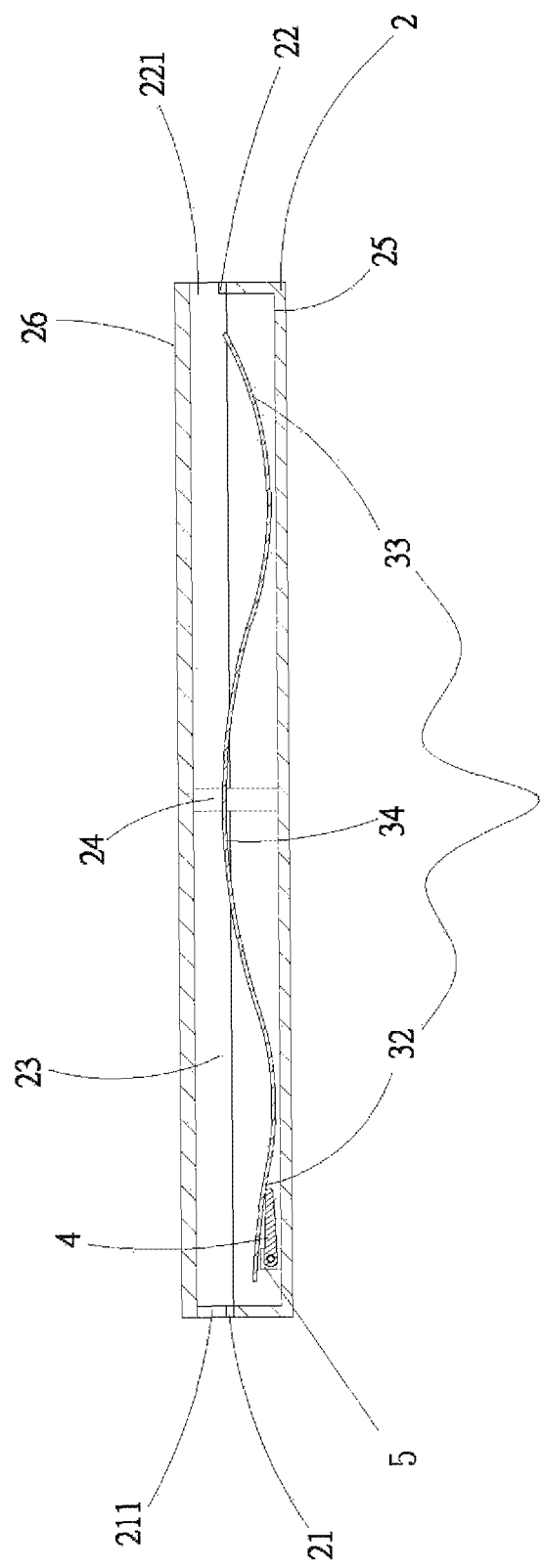
FIG. 4C is a sectional view of the second embodiment of the present invention, showing the application thereof in a third state.

Please now refer to FIGS. 4A, 4B and 4C. FIG. 4A is a sectional view of a second embodiment of the present invention, showing the application thereof in a first state. FIG. 4B is a sectional view of the second embodiment of the present invention, showing the application thereof in a second state. FIG. 4C is a sectional view of the second embodiment of the present invention, showing the application thereof in a third state. The second embodiment is partially identical to the first embodiment in structure and thus will not be repeatedly described hereinafter. The second embodiment is different from the first embodiment in that the drive member 4 is swingable. The drive member 4 is a cam. The drive member 4 is connected to a drive unit 5 for 90-degree driving the drive member 4. The drive member 4 is attached to the plate body 3. When the drive member 4 is rotated, the plate body 3 attached to one end of the drive member 4 is moved up and down according to the eccentricity of the drive member 4. The top end of the drive member 4 pushes the first section 32 of the plate body 3 to the top section 26 of the apparatus case 2. When the top end of the drive member 4 is driven by the drive unit 5 to swing, the plate body 3 instantaneously drops to the bottom section 25 of the apparatus case 2. The first section 32 is moved to the bottom section 25 to compress the air in the receiving space 23 to create airflow. The airflow flows from the first section 32 to the middle section 34 to press the middle section 34. The middle section 34 moves along the locating member 24 toward the top section 26 and at the same time drives the second section 33 to move toward the top section 26 until the airflow flows out from the second opening 221.

Thereafter, the top end of the drive member 4 pushes the first section 32 of the plate body 3 to the top section 26 of the apparatus case 2. When the first section 32 is totally moved to the top section 26, the air outside the apparatus case 2 flows from the first opening 211 into the receiving space 23 due to change of pressure. Then the drive member 4 is again swung. At this time, the first section 32 is moved toward the bottom section 25 to compress the air in the receiving space 23 to create airflow. The airflow flows from the first section 32 to the middle section 34 to press the middle section 34. The middle section 34 moves along the locating member 24 toward the top section 26 and at the same time drives the second section 33 to move toward the top section 26 until the airflow flows out from the second opening 221. Accordingly, an air convection effect takes place between the exterior of the apparatus case 2 and the interior of the apparatus case 2 so that the heat generated by the heat source in the apparatus case 2 can be dissipated. Therefore, the air convection in the limited space of the apparatus body can be effectively enhanced to greatly enhance the heat dissipation efficiency.

Figure 5:
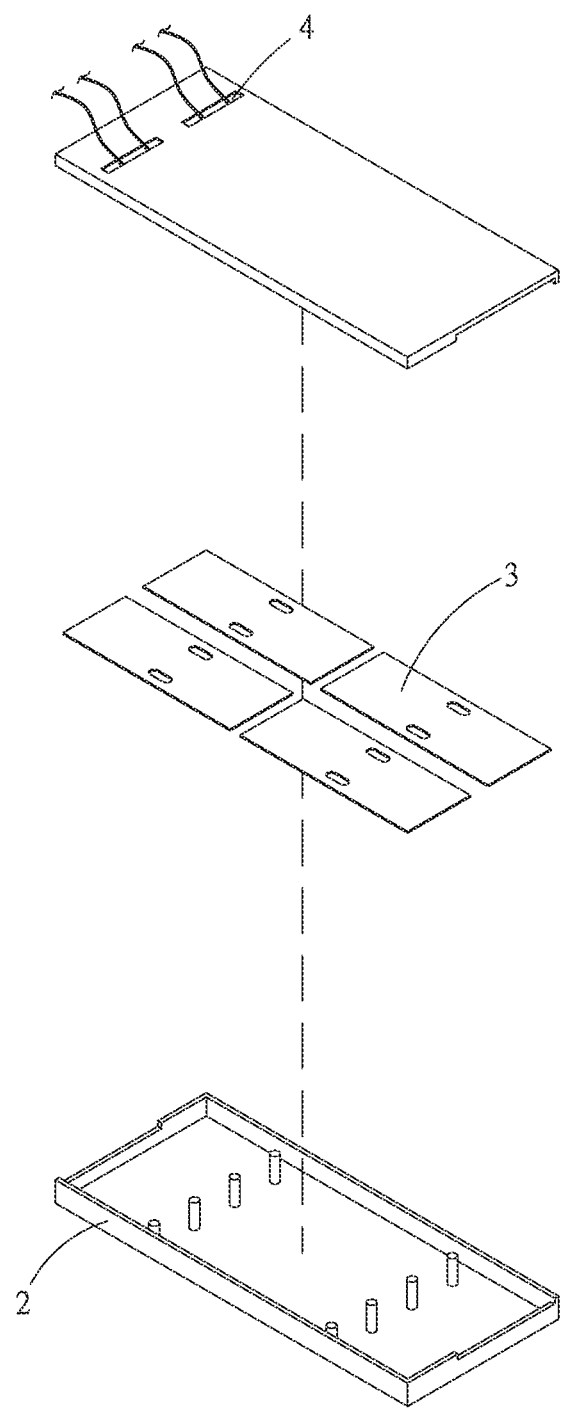
FIG. 5 is a perspective exploded view of a third embodiment of the present invention, showing the application thereof.
Figure 6:
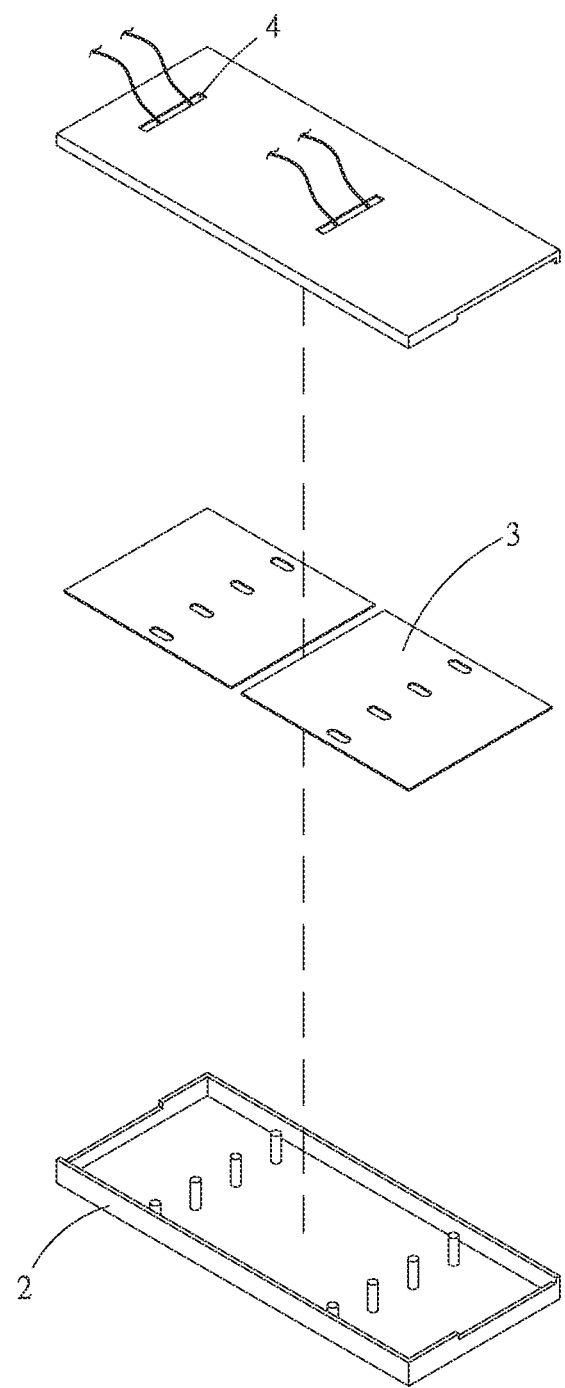
FIG. 6 is a perspective exploded view of a fourth embodiment of the present invention, showing the application thereof.

Please now refer to FIGS. 5 and 6. FIG. 5 is a perspective exploded view of a third embodiment of the present invention, showing the application thereof. FIG. 6 is a perspective exploded view of a fourth embodiment of the present invention, showing the application thereof. The third and fourth embodiments are partially identical to the first embodiment in structure and thus will not be repeatedly described hereinafter. The third and fourth embodiments are different from the first embodiment in that the number of the plate bodies 3 in the apparatus case 2 is two or four. Each plate body 3 has a drive member 4. The plate bodies 3 are respectively driven by the drive members 4, whereby an air convection effect takes place between the exterior of the apparatus case 2 and the interior of the apparatus case 2 so that the heat generated by the heat source in the apparatus case 2 can be dissipated. Therefore, the air convection in the

What is claimed is:

1. An apparatus body heat dissipation device comprising:
an apparatus case having at least one first opening, at least one second opening, at least one cylindrically-shaped locating member and a receiving space in communication with the at least one first and second openings; the at least one cylindrically-shaped locating member extending from a bottom section of the apparatus case to a top section of the apparatus case;

at least one plate body disposed in the receiving space, the at least one plate body having a first section and a second section positioned adjacent to the at least one first and second openings respectively and a middle section between the first and second sections; the at least one plate body further having a perforation formed in a position where each at least one cylindrically-shaped locating member is positioned, the perforation having a shape with a length greater than a width, the width corresponding to the diameter of the at least one cylindrically-shaped locating member and the length extending parallel to a longitudinal direction of the receiving space, such that the at least one cylindrically-shaped locating member passes through the perforation;

at least one drive member disposed on the apparatus case and attached to move and lift the at least one plate body, the at least one drive member serving to drive the at least one plate body to move within the receiving space up and down along the at least one cylindrically-shaped locating member and wherein the movement of the at least one plate body up and down along the at least one cylindrically-shaped locating member produces air convection between the at least one first and second openings; and a drive unit being connected to the at least one drive member to provide 90-degree back and forth rotation of the at least one drive member which causes the at least one plate body to move up and down along the at least one cylindrically-shaped locating member according to the position of the at least one drive member;

wherein the at least one drive member is a cam.

2. The apparatus body heat dissipation device as claimed in claim 1, wherein the at least one drive member drives the first section of the at least one plate body to move up and down within the receiving space to compress the air in the receiving space, whereby the air drives the middle section and the second section of the at least one plate body to move up and down.

3. The apparatus body heat dissipation device as claimed in claim 1, wherein the apparatus case has a first side and a second side, the at least one first and second openings being respectively formed on the first and second sides.

4. The apparatus body heat dissipation device as claimed in claim 1, wherein the at least one plate body is a flexible member.

* * * * *